United States Patent [19]

Mihara

[11] Patent Number: 4,922,317
[45] Date of Patent: May 1, 1990

[54] CMOS DEVICE HAVING SCHOTTKY DIODE FOR LATCH-UP PREVENTION

[75] Inventor: Teruyoshi Mihara, Yokosuka, Japan

[73] Assignee: Nissan Motor Company, Limited, Yokohama, Japan

[21] Appl. No.: 81,391

[22] Filed: Aug. 4, 1987

[30] Foreign Application Priority Data

Aug. 6, 1986 [JP] Japan ................... 61-183476

[51] Int. Cl.⁵ .......................................... H01L 27/02
[52] U.S. Cl. .......................................... 357/42; 357/15
[58] Field of Search .................... 357/15, 42

[56] References Cited

U.S. PATENT DOCUMENTS

| 4,209,713 | 6/1980 | Satou et al. | 307/200 B |
|---|---|---|---|
| 4,327,368 | 4/1982 | Uchida | 357/42 |
| 4,477,310 | 10/1984 | Park et al. | 156/643 |
| 4,513,309 | 4/1985 | Cricchi | 357/15 |
| 4,574,467 | 3/1986 | Halfacre et al. | 29/571 |
| 4,593,459 | 6/1986 | Poppert et al. | 29/577 |
| 4,646,124 | 2/1987 | Zunino | 357/43 |
| 4,647,957 | 3/1987 | Coquin et al. | 357/42 |
| 4,689,653 | 8/1987 | Miyazaki | 357/42 |
| 4,760,035 | 7/1988 | Pfleiderer et al. | 357/42 |

OTHER PUBLICATIONS

Krick-IBM Tech. Dis. Bul.-vol. 13, No. 1, Jun. 1970.

Primary Examiner—Edward J. Wojciechowicz
Attorney, Agent, or Firm—Foley & Lardner, Schwartz, Jeffery, Schwaab, Mack, Blumenthal & Evans

[57] ABSTRACT

A CMOS device having an nMOS formed in a p-type substrate region, and a pMOS formed in an n-type substrate region is provided with a Schottky barrier junction for collecting holes injected into the n-type substrate region, to prevent latch-up. The Schottky barrier junction is formed by a metal electrode and the n-type substrate region, and is located between the pMOS and the nMOS.

20 Claims, 7 Drawing Sheets

CMOS DEVICE HAVING SCHOTTKY DIODE FOR LATCH-UP PREVENTION

BACKGROUND OF THE INVENTION

The present invention relates to a CMOS device, and more specifically to a CMOS device improved in withstanding latch-up.

In the structure of a CMOS, there are formed parasitic pnp and npn transistors which tend to interact and cause latch-up.

FIGS. 11 and 12 show one conventional CMOS device (U.S. Pat. No. 4,209,713, or Denshi-Tsushin-Gakkai-Ronbunshi, '78/2 vol. J61-CN02).

An n-channel MOSFET (nMOS) 7 is formed in a p well 2 which is formed in a main surface of an n-type silicon substrate 1, and a p-channel MOSFET (pMOS) 13 is formed directly in the n substrate 1. The nMOS 7 is constituted by a pair of an n+ source region 3 and an n+ drain region 4 which are both formed in the p well 2, and a gate electrode 5 formed on a gate insulating layer (not shown). A well contact region 6 of the p+ type is formed to connect together the source region 3 of the nMOS 7 and the well region 2 which serves as a substrate region of the nMOS 7. The pMOS 13 is constituted by a pair of a p+ source region 8 and a p+ drain region 9 which are both formed directly in the n substrate 1, and a gate electrode 11 formed on a gate insulating layer (not shown). A substrate contact region 12 of the n+ type is formed to connect together the source region 8 of the pMOS 13 and the substrate 1 which serves as a substrate region of the pMOS 13.

The nMOS 7 and pMOS 13 are interconnected to form a CMOS inverter. The gate electrodes 5 and 11 of both devices 7 and 13 are connected together and connected to an input terminal 14. The drain regions 4 and 9 are connected together, and connected to an output terminal 15. A supply terminal 16 of a supply voltage Vdd is connected to the source region 8 of the pMOS 13, and a low potential terminal 17 of a potential Vss is connected to the source region 3 of the nMOS 7.

In the CMOS device having such a structure, there are formed parasitic pnp transistors $Q_1$ and $Q_3$, and parasitic npn transistors $Q_2$ and $Q_4$, as shown in FIGS. 11 and 12. These parasitic bipolar transistors $Q_1$–$Q_4$ are interconnected, and form a pnpn thyristor structure.

In FIG. 12, $Rn_1$ is a base resistance of the transistor $Q_1$, $Rn_3$ is a base resistance of the transistor $Q_3$, and Rp is a base resistance of the transistor $Q_4$.

When a positive surge voltage equal to or greater than the supply voltage Vdd enters through the output terminal 15, the CMOS device falls into latch-up in the following manner. This surge voltage causes a base current $Ib_1$ to flow between the base and emitter of the transistor $Q_1$, and accordingly a collector current $Ic_1 = Ib_1 \times Hfe_1$ (where $Hfe_1$ is the current gain of the transistor $Q_1$) flows through the base resistance Rp into the low potential terminal 17.

When the voltage drop developed across the base resistance Rp by the collector current $Ic_1$ becomes equal to or greater than a base threshold voltage $Vbth_4$ ($Ic_1 \times Rp \geq 0.6$ V), then a base current $Ib_4$ flows into the transistor $Q_4$, which accordingly draws in a collector current $Ic_4 = Ib_4 \times Hfe_4$ (where $Hfe_4$ is the current gain of the transistor $Q_4$) from the supply terminal 16 through the base resistance $Rn_3$ of the transistor $Q_3$.

This collector current $Ic_4$ generates a voltage drop $Ic_4 \times Rn_3$ across the resistance $Rn_3$. When this voltage drop becomes equal to or greater than a base threshold voltage $Vbth_3$ (approximately equal to 0.6 V) of the transistor $Q_3$, then a current $Ib_3$ flows through the base of the transistor $Q_3$, and the transistor $Q_3$ turns on. Accordingly, a collector current $Ic_3 = Ib_3 \times Hfe_3$ (where $Hfe_3$ is the current gain of the transistor $Q_3$) flows into the transistor $Q_4$ and its base resistance Rp.

In this way, both the pnp transistor $Q_3$ and the npn transistor $Q_4$ are turned on, and the pnpn thyristor structure formed by both transistors $Q_3$ and $Q_4$ is brought into the latch-up state, which persists until the power supply is cut off.

A negative surge voltage equal to or lower than the low potential Vss also triggers latch-up when it is applied to the output terminal 15. In this case, a base current $Ib_2$ is caused to flow in the npn transistor $Q_2$, and accordingly, a collector current $Ic_2$ flows into the transistor $Q_2$ through the base resistance $Rn_3$ of the transistor $Q_3$. This collector current $Ic_2$ develops a voltage drop $Ic_2 \times Rn_3$ across the resistance $Rn_3$. When this voltage drop becomes equal to or greater than the base threshold voltage $Vbth_3$ of the transistor $Q_3$, the transistor $Q_3$ is turned on, and the collector current $Ic_3$ flows through the base resistance Rp of the transistor $Q_4$. Therefore, the transistor $Q_4$ is also turned on when $Ic_3 \times Rp$ becomes equal to or greater than $Vbth_4$. In this way, the thyristor operation causes latch-up again.

Latch-up is very serious. Latch-up disables the CMOS from functioning properly. Furthermore, an excessive current flowing between the supply terminal 16 and the low potential terminal 17 due to latch-up damages the device when the power dissipation exceeds the allowable limit.

Positive or negative surge voltages entering via the input terminal 14 too can trigger latch-up of the CMOS. In general, the CMOS is provided with a voltage clamping circuit (not shown in FIG. 11) composed of diffused resistor and diffused diode, for the purpose of protecting the gate insulating layer from dielectric breakdown. The diffused regions of the voltage clamping circuit form pn junctions with the substrate, and these pn junctions form parasitic bipolar transistors. These parasitic bipolar transistors act and cause latch-up when an excessive surge is applied to the input terminal 14.

There are various measures for preventing latch-up. Typical examples are as follows:

(i) Prevention of external noise: Latch-up can be prevented by limiting the entry of external current noise into the device by the use of resistors or capacitors connected to the input or output terminal.

(ii) Prevention of the thyristor's turning on: The condition required to turn on the thyristor structure formed by the parasitic transistors $Q_3$ and $Q_4$ is given by $Hfe_3 \times Hfe_4 \geq 1$. Therefore, the thyristor is prevented from turning on by designing the CMOS structure such that $Hfe_3 \times Hfe_4$ becomes smaller than one.

(iii) Limitation of current: In this measure, the current through the thyristor is limited below a holding current which is the minimum current required to maintain the thyristor in the on state after it is triggered into the on state.

(iv) Reduction of base resistances: Reduction of the base resistances $Rn_3$ and Rp of the transistors $Q_3$ and $Q_4$ causes reduction of the voltage drops developed across the resistances. Therefore, it becomes more difficult for the transistors $Q_3$ and $Q_4$ to turn on.

Among these measures, (i) and (iii) impose restraints on the output current and operating speed of the CMOS inverter. Therefore, the measures (ii) and (iv) are employed widely.

One conventional example is shown in FIGS. 13 and 14. The CMOS structure shown in FIG. 13 is almost the same as the CMOS structure of FIG. 11, but different in the following points. In the structure of FIG. 13, the distance d between the pMOS 13, and the p well 2 is increased to a value equal to or greater than about 200 micrometers. Therefore, in each of the parasitic pnp transistors $Q_1$ and $Q_3$, the base width is increased, and accordingly, the current gain Hfe is decreased. Furthermore, an $n^+$-type substrate contact region 18 is formed in the n substrate 1 between the pMOS 13 and the nMOS 7, and a $p^+$-type well contact region 19 is formed in the p well 2 so as to surround the nMOS 7. With the contact regions 18 and 19, the base resistances $Rn_1$, $Rn_3$ and $Rp$ of the parasitic transistors $Q_1$, $Q_3$ and $Q_4$ are reduced.

In this device, the p well region 2 is spaced far from the drain region 9. Therefore, most of the holes which are injected from the drain region 9 into the n substrate 1 because of the positive surge voltage applied to the output terminal 15, recombine with electrons and disappear in the n substrate 1. It is only a fraction of the injected holes which can flow into the p well region 2 as the collector current $Ic_1$ of the transistor $Q_1$, and flow out through the base resistance Rp into the low potential terminal 17.

Furthermore, the base resistance Rp is reduced by the $p^+$ well contact region 19. As a result, the voltage drop $Ic_1 \times Rp$ is small, and the transistor $Q_4$ hardly turns on.

If the collector current $Ic_1$ increases, and the transistor $Q_4$ is turned on because of an increase of the voltage drop $Ic_1 \times Rp$, the collector current $Ic_4$ is supplied mostly from the substrate contact region 18, and the collector current $Ic_4$ coming from the substrate contact region 12 adjacent the source region 8 is very small.

The base resistance $Rn_3$ is reduced by the path of the $n^+$ substrate contract region 18. Therefore, the transistor $Q_4$ is hardly turned on even if the collector current $Ic_4$ flows therethrough.

With this structure which makes it difficult for the parasitic thyristor to turn on, the CMOS device of FIG. 13 is improved in withstanding latch-up.

However, the CMOS device of FIG. 13 is disadvantageous in that the chip size and the fabricating cost are increased by the necessity for increasing the distance d between the pMOS 13 and the p well 2 beyond 200 micrometers.

FIGS. 15 and 16 show another conventional CMOS device. The CMOS structure of FIG. 15 is the same as that of FIG. 13 except that the device of FIG. 15 is further provided with a p-type hole collector region 21 in the n substrate 1 between the pMOS 13 and the $n^+$ substrate contact region 18. The hole collector region 21 is connected with the low potential terminal 17 of Vss, and therefore, serves as a collector of the pnp transistor $Q_1$, as shown in FIG. 16.

When a positive surge equal to or greater than Vdd enters the device from the output terminal, the hole collector region 21 collects the holes injected from the drain region 9 of the pMOS 13 into the n substrate 1, and leads them to the low potential point of Vss. By so doing, the hole collector region 21 reduces the collector current $Ic_1$ of the transistor $Q_1$ flowing into the p well region 2 to a very low value.

In the CMOS structure of FIG. 15, the capability of withstanding latch-up is improved with the hole collector region 21 instead of increasing the distance d between the pMOS 13 and the p well 2, and hence without the necessity of increasing the chip size too much.

However, the CMOS structure of FIG. 15 requires not only the hole collector region 21, but also a metal lead connecting the hole collector region 21 to the low potential Vss, and a metal lead connecting the substrate contact region 18 to the supply voltage Vdd both of which must be formed on the top side of the semiconductor substrate 1. Therefore, the actual layout is considerably complicated, and reduction in chip size is not so easy.

Recently, there has been proposed a MOS device having a Schottky source-drain structure. This structure eliminates the possibility of injection of the minority carriers at least in principle, so that the device is more resistant to latch-up. However, this structure introduces an undesired offset voltage, and decreases the transconductance gm by increasing the source resistance.

SUMMARY OF THE INVENTION

It is an object of the present invention to provide a CMOS device which is improved in capability of withstanding latch-up with a relatively simple structure suitable for chip size reduction.

According to the present invention, a CMOS device comprises an n-type substrate region and a p-type substrate region which are both formed in a monolithic semiconductor substrate body, a p-type pair of source and drain regions formed in the n-type substrate region to form a p-channel MOSFET with a first insulated gate, n-type source and drain regions formed in the p-type substrate region to form an n-channel MOSFET with a second insulated gate, and a metal electrode joined with the n-type substrate region to form a Schottky barrier junction for collecting minority carriers in the n-type substrate region. The Schottky barrier junction is located between the p-type pair and the n-type pair.

DETAILED DESCRIPTION OF THE INVENTION

Figure 1:
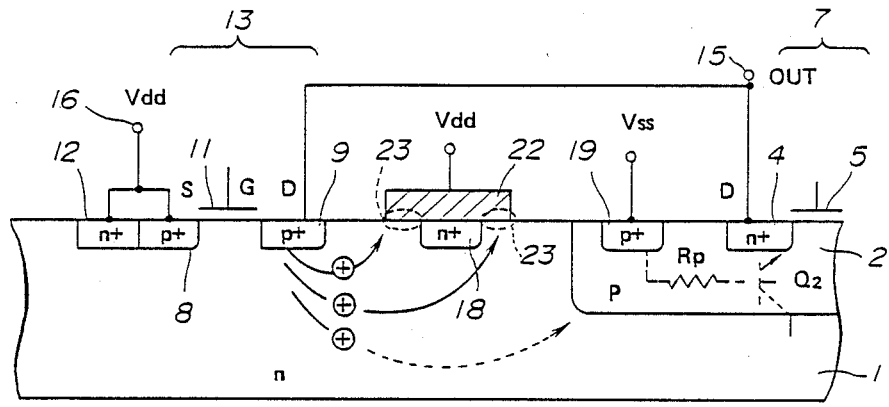
FIG. 1 is a vertical section showing a CMOS device of a first embodiment of the present invention.
Figure 2:
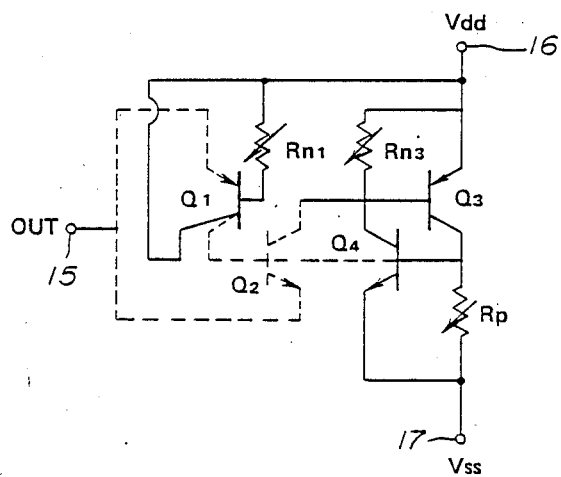
FIG. 2 is a diagram of an equivalent circuit showing an arrangement of parasitic transistors formed in the device of FIG. 1.

A first embodiment of the present invention is shown in FIGS. 1 and 2.

Figure 11:
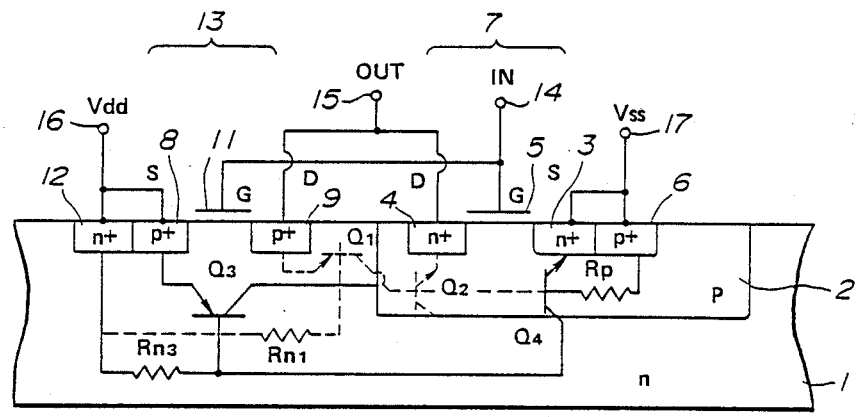
FIG. 11 is a vertical section showing a first conventional CMOS device.
Figure 12:
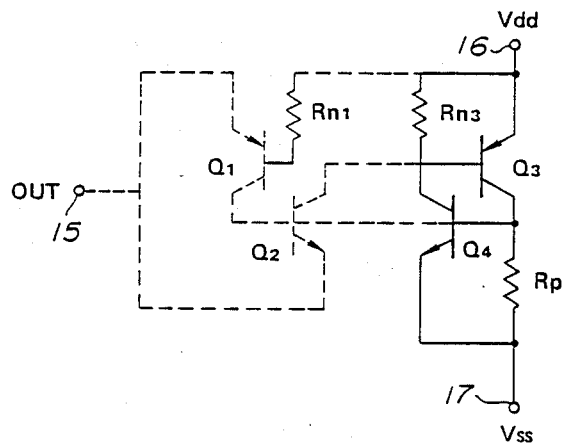
FIG. 12 is a diagram of an equivalent circuit for the conventional device of FIG. 11.
Figure 13:
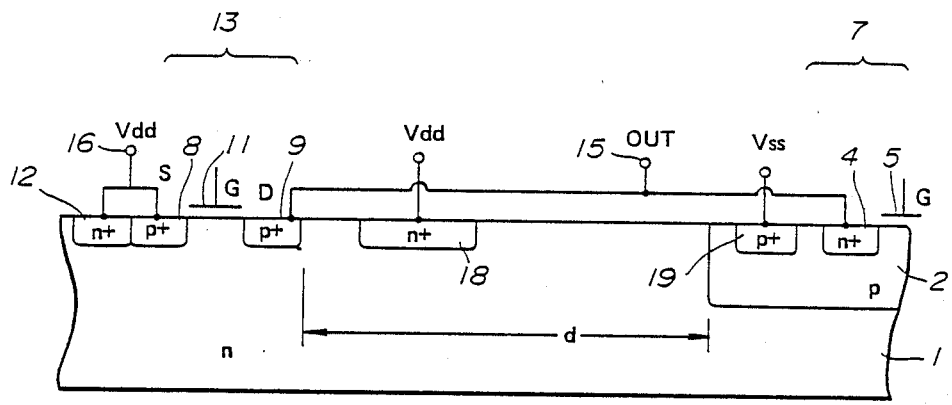
FIGS. 13 and 14 are a vertical section and an equivalent circuit diagram showing a second conventional CMOS device.
Figure 14:
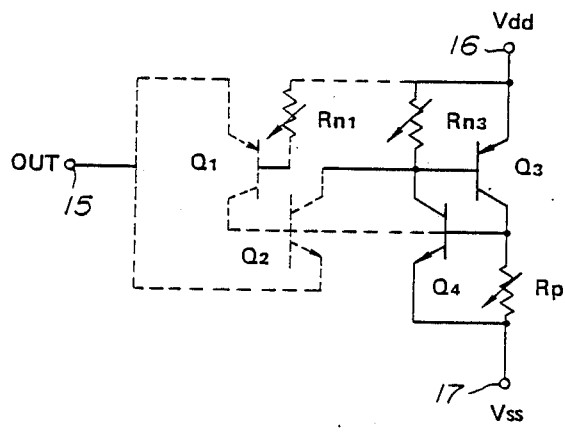

The basic structure of the CMOS device of the first embodiment is the same as the conventional structure of FIG. 11, as shown in FIG. 1 by using the same reference numerals. The CMOS structure of the first embodiment is further provided with an n+-type substrate contact region 18, a p+-type well contact region 19, and a metal electrode 22. The substrate contact region 18 is formed in the n substrate 1 between the pMOS 13 and the nMOS 7 formed in the p well region 2, like the region 18 of the conventional device of FIG. 13. The well contact region 19 is formed in the p well 2 in such a manner as to surround the nMOS 7, like the region 19 of the conventional device of FIG. 13.

The metal electrode 22 is formed on the n+-type substrate contact region 18. The area of the metal electrode 22 is greater than the area of the substrate contact region 18. The metal electrode 22 covers the substrate contact region 18, and a peripheral portion of the metal electrode 22 extends beyond the substrate contact region 18. The peripheral portion of the metal electrode 22 is joined with the n-type substrate 1, and a Schottky barrier junction 23 is formed around the substrate contact region 18 by contact between the metal electrode 22 and the n-type substrate 1.

In this embodiment, the metal electrode 22 is made of Aluminum which is capable of forming a Schottky junction with an n-type Si. Accordingly, Al interconnection metal is used as the metal electrode 22, and the Schottky junction 23 is formed by an Al-nSi junction.

In this embodiment, the supply voltage Vdd is applied to the metal electrode 22.

A central portion of the metal electrode 22 is in ohmic contact with the highly doped n+-type substrate contact region 18.

It is possible to form the Schottky diode 23 of this embodiment by using the contact hole opening step and the metallization step of the usual CMOS fabrication process without need for an additional step. At the contact hole opening step, a contact hole is opened in an SiO$_2$ layer (not shown) formed on the semiconductor surface, to expose the n+ substrate contact region 18 and the surrounding area. Then, the Al interconnection layer is deposited and patterned in the usual manner at the metallization step.

The CMOS device of this first embodiment is operated as follows:

The supply voltage Vdd is applied to the metal electrode 22, and the supply voltage Vdd is further applied to the n substrate region 1 through the n+ substrate contact region 18. Therefore, the Schottky diode 23 is in the condition in which neither a forward bias nor a reverse bias is applied.

In general, a Schottky diode is in an equilibrium state when no external bias voltage is applied. In this state, positively ionized n-type impurity atoms are distributed in the n-type semiconductor side as positive space charges, and electrons are distributed in the metal side as negative surface charges. These charges produce an electric field across the interface pointing from the semiconductor side to the metal side, so that motion of electrons is prevented, and equilibrium is reached.

The barrier height φms of the Schottky junction is lower than that of a pn semiconductor-semiconductor junction.

Figures 10A, 10B:
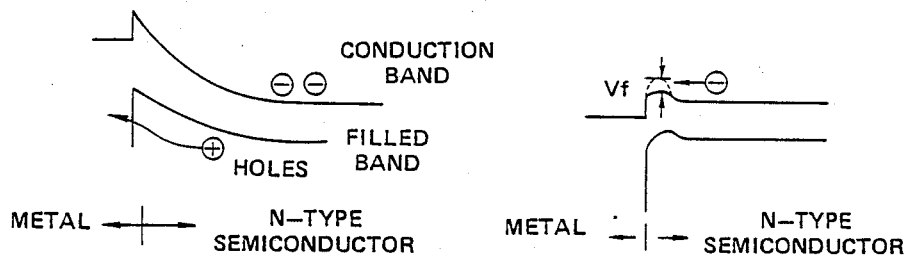
FIGS. 10A and 10B are energy band diagrams for a Schottky barrier junction under different bias conditions.

FIGS. 10A and 10B show changes in energy levels when a reverse bias voltage and a forward bias voltage are applied to the Schottky junction.

When a reverse bias is applied, as shown in FIG. 10A, the barrier height is increased by an amount corresponding to the reverse bias voltage. Therefore, motion of electrons from the n-type semiconductor to the metal becomes less probable, and holes (minority carriers) in the n semiconductor flow out into the metal side.

When the Schottky junction is forward biased, the barrier height as viewed from the n semiconductor side toward the metal side is lowered as shown in FIG. 10B, and electrons cross the junction from the n semiconductor side to the metal side. However, holes are not injected from the metal to the n semiconductor because there are no holes in the metal side.

In the CMOS device of FIG. 1, when a positive surge voltage exceeding the supply voltage Vdd enters the device via the output terminal 15, holes are injected from the drain region 9 of the pMOS 13 into the n substrate region 1. However, the holes diffusing in the n substrate region 1 near the Schottky junction 23 are absorbed into the Schottky junction 23 whose barrier height is low and which has electrons distributed in the metal electrode 22 as the negative surface charges. This absorption causes a decrease in the collector current Ic$_1$ of the transistor Q$_1$ flowing into the p well region 2.

Figure 15:
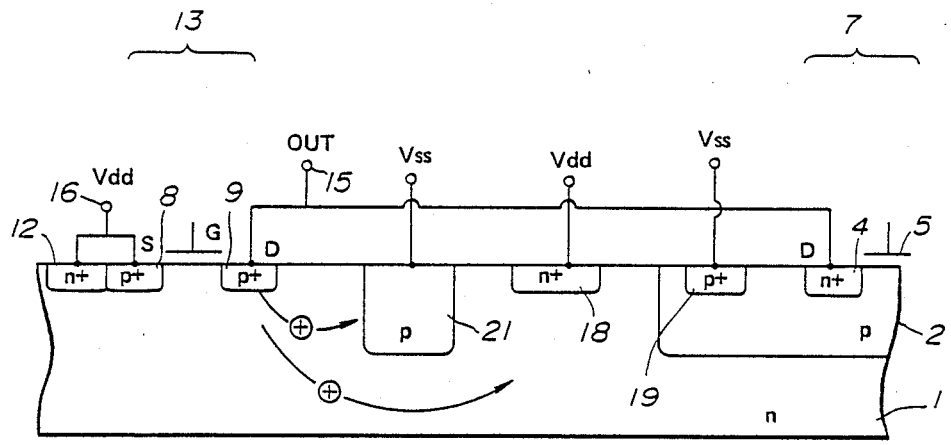
FIGS. 15 and 16 are a vertical section and an equivalent circuit diagram showing a third conventional CMOS device.
Figure 16:
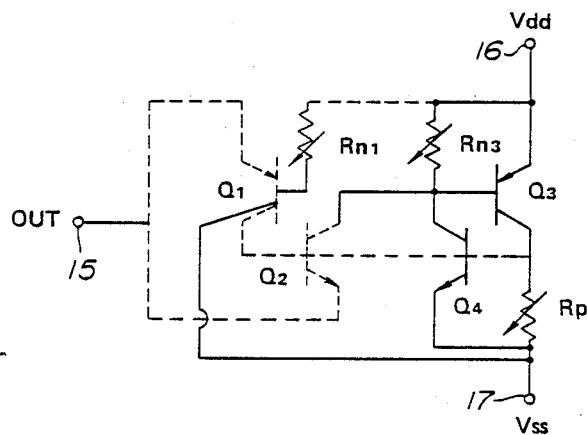

The function of the Schottky junction 23 is similar to that of the hole collector region 21 of the third conventional device shown in FIG. 15. However, the Schottky junction 23 and the n+ substrate contact region 18 are connected to the supply voltage Vdd via the common metal electrode 22, whereas, in the conventional device of FIG. 15, the hole collector region 21 is connected to the low potential Vss, and the substrate contact region 18 is connected to the supply voltage Vdd. Therefore, the structure of the first embodiment can simplify the layout and interconnections.

In the conventional device of FIG. 15, it is undesirable to connect the hole collector region 21 to the supply voltage Vdd because, when a negative surge voltage under Vss enters the device via the output terminal 15, a voltage drop developed near the n+ substrate contact region 18 causes the hole collector region 21 of the p-type to act as a source for injecting holes into the substrate 1, and accordingly the risk of latch-up is increased.

In contrast, the Schottky diode 23 is a majority carrier device in essence, and therefore there is no injection of holes into the n semiconductor substrate region 1.

When a negative surge voltage below Vss enters the device of the first embodiment via the output terminal 15, the npn transistor Q$_2$ may be turned on. However, the collector current Ic$_2$ of the transistor Q$_2$ is supplied from the n+ substrate contact region 18, and the collector current $I_{c2}$ coming from the n+ substrate region 12 adjacent to the source region 8 is very low. Therefore, the pnp transistor $Q_3$ is restrained from turning on by decrease in the voltage drop near the source region 8, and the risk of latch-up is reduced.

If a greater negative surge voltage is applied, then the collector current $I_{c2}$ of the transistor $Q_2$ increases, and the voltage drop near the n+ substrate contact region 18 increases, so that the Schottky junction 23 becomes forward-biased. However, the current flow in the Schottky diode is only by electrons (majority carriers), so that the forward-biased Schottky junction 23 acts as if it were an extension of the n+ substrate contact region 18. Therefore, the collector current $I_{c2}$ is supplied in a larger amount from both the n+ substrate contact region 18 and the Schottky junction 23, and accordingly latch-up is prevented.

In this way, the Schottky junction 23 serves, on one hand, for collecting holes (minority carriers), and serves, on the other hand, as a source for supplying collector currents to the parasitic transistors $Q_2$ and $Q_4$. The Schottky junction 23, therefore, is effective against both the positive and negative surges.

Figure 3:
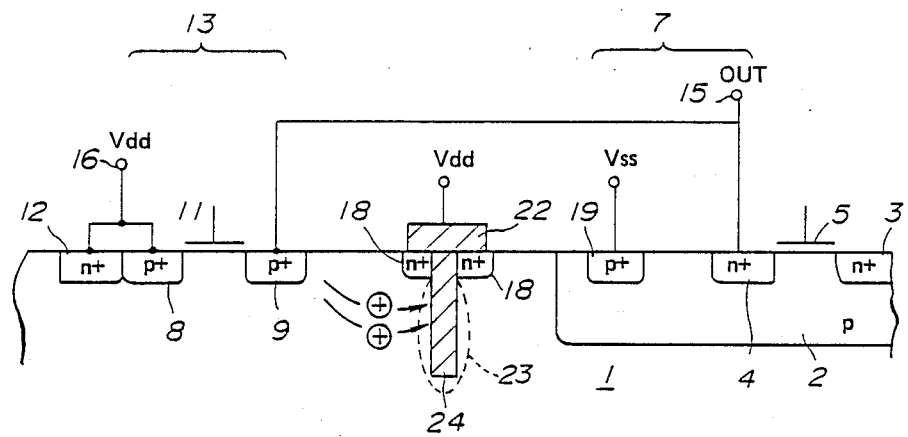
FIG. 3 is a vertical section showing a CMOS device of a second embodiment of the present invention.

A second embodiment of the present invention is shown in FIG. 3. In the second embodiment, a depression is formed in the main surface of the n semiconductor substrate 1, and the depression is filled with a metal 24 to form a Schottky junction 23. The depression can be formed easily by RIE (Reactive Ion Etching). The metal 24 in the depression constitutes an inner portion of the metal electrode 22.

The metal electrode 22 of the second embodiment is not enlarged beyond the n+ substrate contact region 18, and the inner portion 24 passes through the n+ substrate region 18, as shown in FIG. 3.

The Schottky junction structure of the second embodiment makes it possible to increase the interface area of the Schottky junction 23 without increasing the chip size. The Schottky junction 23 of the second embodiment can more efficiently absorb holes injected into the n substrate 1, and accordingly prevent latch-up more efficiently.

Figure 4A:
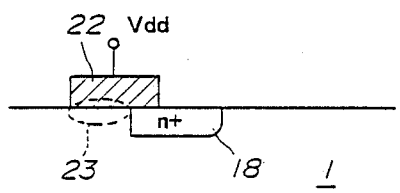
FIGS. 4A and 4B are vertical sections showing modifications of a Schottky junction structure of FIG. 1.
Figure 4B:
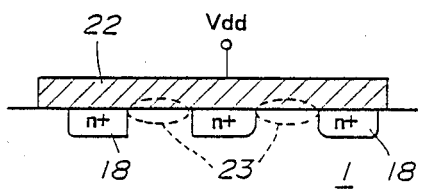

FIGS. 4A and 4B show two different modifications of the Schottky junction structure of FIG. 1. In the structure of FIG. 4A, the Schottky junction 23 is formed only on one side of the n+ substrate contact region 18. The structure of FIG. 4B has two or more n+ substrate contact regions 18, and a single metal electrode 22 which is formed over all of the substrate contact regions 18 so that there are formed one or more Schottky junctions 23 bounded between two of the substrate contact regions 18. The Schottky junction structures of FIGS. 4A and 4B act in a similar manner as in the first embodiment.

Figure 5:
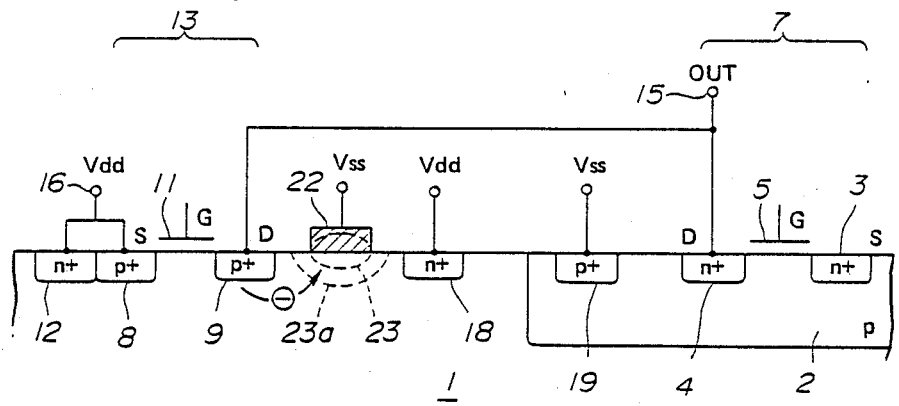
FIG. 5 is a vertical section showing a CMOS device of a third embodiment of the present invention.

A third embodiment of the present invention is shown in FIG. 5. In the third embodiment, the metal electrode 22 is spaced apart from the n+ substrate contact region 18, so that the Schottky junction 23 formed by the metal electrode 22 and the n substrate 1 is apart from the substrate contact region 18. The metal electrode 22 is connected to the low potential Vss, instead of the supply voltage Vdd.

The Schottky junction 23 of the third embodiment is reverse-biased by a voltage (Vdd-Vss), so that a depletion layer 23a extends into the n substrate region 1. Therefore, the Schottky junction 23 of this embodiment extracts holes from the n substrate region 1 efficiently, and improves the capability of withstanding latch-up.

Figure 6:
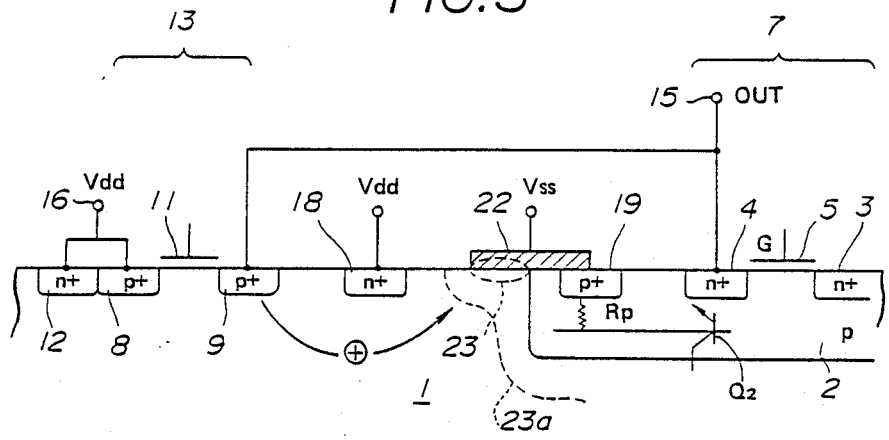
FIG. 6 is a vertical section showing a CMOS device of a fourth embodiment of the present invention.

A fourth embodiment of the present invention is shown in FIG. 6. In the fourth embodiment, the metal electrode 22 is formed astride the boundary between the n substrate 1 and the p well 2. A first half of the metal electrode 22 is formed on the n substrate 1, and joined with the n substrate 1 to form a Schottky junction 23 which adjoins the p well 2. A second half of the metal electrode 22 is formed on the p well, and put in contact with the p+ well contact region 19. The metal electrode 22 is separated from the n+ substrate contact region 18, and connected to the low potential Vss.

In the fourth embodiment, the pn junction between the p well 2 and the n substrate 1, and the Schottky junction 23 are both reverse-biased by the voltage (Vdd-Vss), so that a depletion layer 23a extends in the n substrate 1 over a wide area covering both the Schottky junction, and the pn junction.

Therefore, holes injected into the n substrate region 1 by the positive surge voltage applied to the output terminal 15 flow into the depletion layer 23a, and go out into the metal electrode 22.

When the transistor $Q_2$ is turned on by the negative surge voltage applied to the output terminal 15, its collector current $I_{c2}$ is supplied from the n+ substrate contact region 18, and the Schottky junction 23 becomes forward-biased with an increase of the collector current $I_{c2}$. Therefore, the Schottky junction 23 supplies the collector current $I_{c2}$, and further reduces the risk of latch-up.

The Schottky junction 23 of the fourth embodiment can be easily formed merely by modifying the pattern of the metal lead connecting the p+ well contact region 19 to the low potential Vss so that the metal lead extends beyond the p well 2, and overlaps the n substrate region 1.

Figures 7A, 7B, 7C:
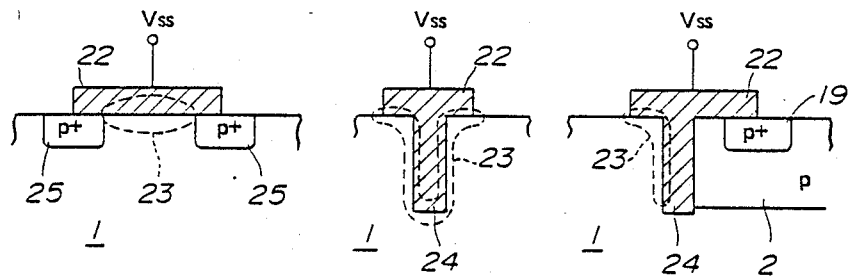
FIGS. 7A, 7B and 7C are vertical sections showing various modifications of the Schottky junction structure of the present invention.

FIGS. 7A, 7B and 7C show various modifications of the Schottky junction structure of the present invention.

In the structure of FIG. 7A, a p+ guard ring 25 is formed in the n substrate 1, and the Schottky junction 23 is formed in the guard ring 25. The guard ring 25 around the Schottky junction 23 improves the withstand voltage of the Schottky junction 23.

The Schottky junction structure of FIG. 7B is similar to that of the second embodiment shown in FIG. 3 in that the metal electrode 22 has an inner portion 24 in a depression formed in the n substrate 1. However, the metal electrode of FIG. 7B is connected to the low potential Vss, and separated from the n+ substrate contact region 18 as in the third embodiment. In the structure of FIG. 7B, the area of the Schottky junction 23 can be increased without increasing the area of the chip.

The structure of FIG. 7C is a variation of trench isolation. A depression is formed between the p well 2 and the n substrate 1, and an inner portion 24 of the metal electrode 22 is formed by filling the depression with a metal. Thus, the side of the p well 2 is separated from the n substrate region 1 by the inner portion 24 of the metal electrode 22. The Schottky junction 23 of FIG. 7C extends from the top surface of the n substrate 1 to the deepest end of the inner portion 24. In the structure of FIG. 7C, the interface of the Schottky junction 23 is enlarged, as compared with the structure of FIG. 6.

Figure 8A:
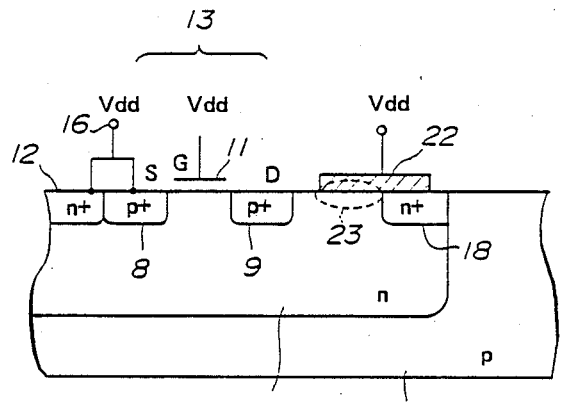
FIG. 8A is a vertical section showing a main portion of a CMOS device of a fifth embodiment of the present invention.

A fifth embodiment of the present invention is shown in FIG. 8A. In this embodiment, the present invention is applied to a so-called n-well CMOS. As shown in FIG. 8A, an n-type well 32 is formed in the main surface of a p-type Si substrate 31. The nMOS 7 is formed in the p-type substrate 31, and the pMOS 13 is formed in the n well 32. The metal electrode 22 is formed on the n well 32, and the Schottky junction 23 is formed by the n well 32 and the metal electrode 22. The Schottky junction structure of FIG. 8A is similar to the structure of FIG. 4A.

Figure 8B:
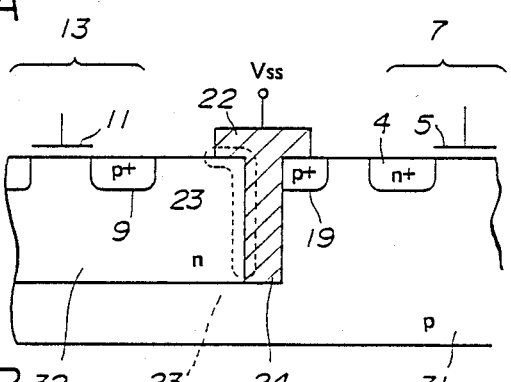
FIG. 8B is a vertical section similar to FIG. 8A, but showing a modification.

FIG. 8B shows a modification of the structure of FIG. 8A. The Schottky junction structure of FIG. 8B is similar to the structure of FIG. 7C, except that the n-type substrate region of the pMOS 13 is in the form of the n well 32 and the p substrate region of the nMOS 7 is in the form of the p substrate 31.

The Schottky junctions 23 of FIGS. 8A and 8B can absorb holes injected into the n well 32 in the same manner as in the preceding embodiments.

Figure 9:
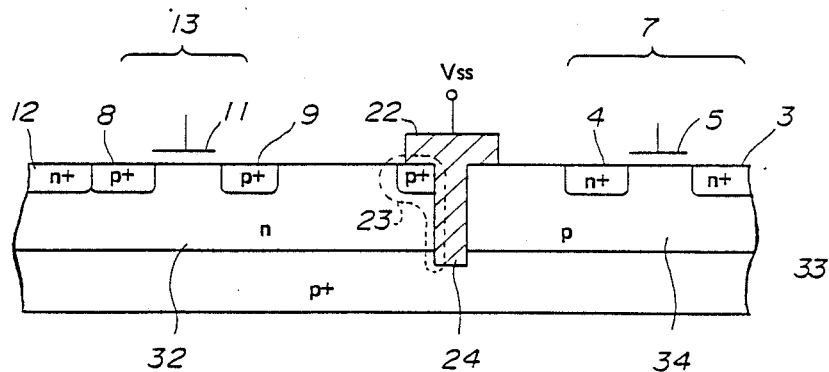
FIG. 9 is a vertical section showing a portion of a CMOS device of a sixth embodiment.

FIG. 9 shows a sixth embodiment in which the present invention is applied to a so-called dual-well CMOS. As shown in FIG. 9, an epitaxial substrate 33 has an n well 32 and a p well 34 which are both formed on a p+ underlying layer. The nMOS 7 is formed in the p well 34, and the pMOS 13 is formed in the n well 32. The Schottky junction structure of FIG. 9 is similar to that of FIG. 8B. The device of FIG. 9 further has a p+-type guard ring adjoining the metal electrode 22.

The Schottky junction structures of FIGS. 7C, 8B and 9 are compatible with a trench isolation technique employed in D-RAMs of the megabit class, and the fabrication of these structures is relatively easy.

The conventional trench isolation structure using an insulating material in a depression does have the function of preventing diffusion of injected minority carriers, but it does not have the function of extracting injected minority carriers. In contrast, the Schottky junction structures of FIGS. 7C, 8B and 9 are capable of extracting injected minority carriers, so that both isolation and latch-up prevention are achieved simultaneously.

The CMOS structures according to the present invention can prevent latch-up not only when an excessive surge voltage enters via the output terminal, but they can also prevent latch-up when an excessive surge voltage enters via the input terminal or the output terminal arranged in an open drain configuration. It is possible to prevent latch-up caused through the input terminal or the output terminal in the open drain configuration more efficiently by slightly modifying the structure of each embodiment mentioned above.

What is claimed is:

1. A CMOS device comprising:
   an n-type substrate region and a p-type substrate region which are both located in a single semiconductor substrate body,
   a p-type pair of source and drain regions located in said n-type substrate region to form a p-channel MOSFET with a first insulated gate,
   an n-type pair of source and drain regions located in said p-type substrate region to form an n-channel MOSFET with a second insulated gate, and
   a metal electrode joined with said n-type substrate region to form a Schottky junction between said p-channel MOSFET and said n-channel MOSFET, said Schottky junction collecting minority carriers in said n-type substrate region,
   wherein said CMOS device further comprises first conductor means for connecting both of said first and second insulated gates to an input terminal, second conductor means for connecting said p-type and n-type drain regions to an output terminal, third conductor means for applying a second supply voltage to said n-type source region of said n-channel MOSFET, and fifth conductor means for applying one of said first and second supply voltages to said metal electrode.

2. A CMOS device according to claim 1 wherein said CMOS device further comprises an n+-type contact region located in said n-type substrate region between said p-channel MOSFET and said n-channel MOSFET, and said metal electrode is located on said n+-type contact region so that said metal electrode is in ohmic contact with said n+-type contact region.

3. A CMOS device according to claim 2 wherein said fifth conductor means is arranged to apply said first supply voltage to said metal electrode.

4. A CMOS device according to claim 3 wherein said n+-type contact region is surrounded by said Schottky junction.

5. A CMOS device according to claim 3 wherein said metal electrode has an inner portion extending deep into said n-type substrate region forming said Schottky junction with said n-type substrate region, said semiconductor substrate body has a depression vertically extending from one major surface of said semiconductor substrate body into said semiconductor substrate body, said inner portion is located in said depression, and wherein said Schottky junction is located in said semiconductor substrate body below said major surface.

6. A CMOS device according to claim 3 wherein said Schottky junction is formed only on one side of said n+-type contact region.

7. A CMOS device according to claim 3 wherein a plurality of n+-type contact regions are located in said n-type substrate region, and said metal electrode is located over said n+-type contact regions so that said Schottky junction is formed by said metal electrode and a portion of said n-type substrate region lying between said n+-type contact regions.

8. A CMOS device according to claim 1 wherein said fifth conductor means is arranged to apply said second supply voltage to said metal electrode.

9. A CMOS device according to claim 8 wherein said Schottky junction is separate from said p-type substrate region.

10. A CMOS device according to claim 9 wherein said Schottky junction is surrounded by a p+-type guard ring located in said n-type substrate region.

11. A CMOS device according to claim 9 wherein said metal electrode has an inner portion extending deep into said n-type substrate region and forming said Schottky junction with said n-type substrate region.

12. A CMOS device according to claim 8 wherein said metal electrode extends over a boundary between said n-type and p-type substrate regions.

13. A CMOS device according to claim 12 wherein said metal electrode has an inner portion located between said n-type and p-type substrate regions.

14. A CMOS device according to claim 1 wherein said p-type substrate region is located in said n-type substrate region.

15. A CMOS device according to claim 1 wherein said n-type substrate region is located in said p-type substrate region.

16. A CMOS device according to claim 1 wherein said n-type and p-type substrate regions are located on an underlying layer.

17. A CMOS device according to claim 16 wherein said underlying layer is a p+-type.

18. A CMOS device according to claim 1 wherein said CMOS device further comprises an n+-type contact region located in said n-type substrate region and connected to a first high potential terminal for applying said first supply voltage to said n-type substrate region, and a p+-type contact region located in said p-type substrate region and connected to a second high potential terminal for applying said second supply voltage, which is lower than said first supply voltage, to said p-type substrate region, and wherein said metal electrode is connected to one of said first and second high potential terminals by said fifth conductor means so that said Schottky junction is normally zero-biased or reverse-biased for collecting minority carriers in said n-type substrate region.

19. A CMOS device according to claim 18 wherein said n+-type contact region is located between said n-channel MOSFET and said p-channel MOSFET.

20. A CMOS device according to claim 1 wherein said Schottky junction is separated from said p-type drain region of said p-channel MOSFET by said n-type substrate region.

* * * * *